(12) United States Patent
Jindo et al.

(10) Patent No.: US 9,184,070 B2
(45) Date of Patent: Nov. 10, 2015

(54) DENSE COMPOSITE MATERIAL, METHOD FOR MANUFACTURING THE SAME, JOINED BODY, AND MEMBER FOR SEMICONDUCTOR MANUFACTURING APPARATUSES

(71) Applicant: NGK Insulators, Ltd., Nagoya (JP)

(72) Inventors: Asumi Jindo, Okazaki (JP); Katsuhiro Inoue, Ama-Gun (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 47 days.

(21) Appl. No.: 14/220,289

(22) Filed: Mar. 20, 2014

(65) Prior Publication Data
US 2014/0287245 A1    Sep. 25, 2014

(30) Foreign Application Priority Data
Mar. 25, 2013    (JP) .................................. 2013-061856

(51) Int. Cl.
*B32B 9/00*    (2006.01)
*B32B 9/04*    (2006.01)
(Continued)

(52) U.S. Cl.
CPC .......... *H01L 21/67109* (2013.01); *B21D 53/02* (2013.01); *B32B 9/005* (2013.01); *B32B 37/10* (2013.01); *B32B 38/0012* (2013.01); *C04B 35/5615* (2013.01); *C04B 35/575* (2013.01); *C04B 35/62635* (2013.01); *C04B 37/006* (2013.01); *H01L 21/6833* (2013.01); *B32B 2311/00* (2013.01); *B32B 2311/24* (2013.01); *B32B 2315/02* (2013.01); *C04B 2235/3826* (2013.01); *C04B 2235/3843* (2013.01);

(Continued)

(58) Field of Classification Search
CPC ............ C04B 35/5611; C04B 35/5615; C04B 35/565; C04B 2235/3826
USPC .................. 264/332; 428/219, 446, 698, 699; 501/88, 91, 93
See application file for complete search history.

(56) References Cited

U.S. PATENT DOCUMENTS 4,729,972 A * 3/1988 Kodama et al. ................. 501/91
5,500,394 A * 3/1996 Kondakov ....................... 501/89
5,942,455 A * 8/1999 Barsoum et al. ............... 501/91

FOREIGN PATENT DOCUMENTS

JP  2006-143580 A1    6/2006
JP  2007-261830    * 10/2007 .............. C04B 35/56
JP  2008-162875    *  8/2008 .............. C04B 35/56

OTHER PUBLICATIONS

Qin et al., "Microstructure Characterization and Mechanical Properties of TiSi2-SiC-Ti3SiC2 Composites prepared by Spark Plasma Sintering", Materials Transactions, vol. 47, No. 3, 2006, pp. 845-848.*

(Continued)

*Primary Examiner* — Jonathan Langman
(74) *Attorney, Agent, or Firm* — Burr & Brown, PLLC

(57) ABSTRACT

A dense composite material according to the present invention contains, in descending order of content, silicon carbide, titanium silicon carbide, and titanium carbide as three major constituents. The dense composite material contains 51% to 68% by mass of silicon carbide and no titanium silicide and has an open porosity of 1% or less. This dense composite material has properties such as an average linear thermal expansion coefficient of 5.4 to 6.0 ppm/K at 40° C. to 570° C., a thermal conductivity of 100 W/m·K or more, and a four-point bending strength of 300 MPa or more.

10 Claims, 4 Drawing Sheets

(51) Int. Cl.

| | | |
|---|---|---|
| *B32B 13/04* | (2006.01) | |
| *B32B 19/00* | (2006.01) | |
| *A61F 13/15* | (2006.01) | |
| *C04B 35/653* | (2006.01) | |
| *C04B 35/52* | (2006.01) | |
| *C04B 35/56* | (2006.01) | |
| *H01L 21/67* | (2006.01) | |
| *C04B 35/575* | (2006.01) | |
| *C04B 35/626* | (2006.01) | |
| *C04B 37/00* | (2006.01) | |
| *B21D 53/02* | (2006.01) | |
| *B32B 37/10* | (2006.01) | |
| *B32B 38/00* | (2006.01) | |
| *H01L 21/683* | (2006.01) | |
| *H01L 21/687* | (2006.01) | |

(52) U.S. Cl.
CPC . *C04B2235/3891* (2013.01); *C04B 2235/5436* (2013.01); *C04B 2235/5472* (2013.01); *C04B 2235/656* (2013.01); *C04B 2235/77* (2013.01); *C04B 2235/80* (2013.01); *C04B 2235/96* (2013.01); *C04B 2235/9607* (2013.01); *C04B 2237/365* (2013.01); *C04B 2237/366* (2013.01); *C04B 2237/402* (2013.01); *C04B 2237/708* (2013.01); *H01L 21/6831* (2013.01); *H01L 21/68757* (2013.01)

(56) References Cited

OTHER PUBLICATIONS

Tang et al., "Ti3SiC2-64Volume percent SiC", Journal of Inorganic Materials, vol. 24, No. 4, 2009, pp. 821-826.*
Mogilevsky et al., "Toughening of SiC with Ti3SiC2 Particles", Journal of the American ceramic Society, vol. 89, No. 2, 2006, pp. 633-637.*
STIC Search conducted by Julia Wang, technical Searcher EIC 1700 on Jun. 18, 2015.*
U.S. Appl. No. 14/515,736, filed Oct. 16, 2014, Jindo et al.
U.S. Appl. No. 14/515,800, filed Oct. 16, 2014, Jindo et al.

* cited by examiner

DENSE COMPOSITE MATERIAL, METHOD FOR MANUFACTURING THE SAME, JOINED BODY, AND MEMBER FOR SEMICONDUCTOR MANUFACTURING APPARATUSES

BACKGROUND OF THE INVENTION

1. Field of the Invention

The present invention relates to dense composite materials, methods for manufacturing such materials, joined bodies, and members for semiconductor manufacturing apparatuses.

2. Description of the Related Art

An electrostatic chuck, which is heated to high temperatures during semiconductor processes, has a cooling plate joined thereto for heat radiation. In this case, the material used for the electrostatic chuck may be aluminum nitride, the material used for the cooling plate may be aluminum, and the joining material used may be a resin. Aluminum nitride and aluminum have an extremely large difference in linear thermal expansion coefficient. For example, aluminum nitride has a linear thermal expansion coefficient of 5.0 ppm/K (RT-800° C., "Physics of Ceramics", Uchida Rokakuho Publishing Co., Ltd.), whereas aluminum has a linear thermal expansion coefficient of 31.1 ppm/K (RT-800° C., "Thermophysical Properties Handbook New Edition", edited by Japan Society of Thermophysical Properties). Such an electrostatic chuck uses a soft resin as the joining material so that the stress due to the difference in linear thermal expansion coefficient can be relieved.

CITATION LIST

Patent Literature

[PTL 1] Japanese Unexamined Patent Application Publication No. 2006-143580

SUMMARY OF THE INVENTION

The electrostatic chuck described above uses a resin as the joining material; however, resins, which are organic materials, have low heat radiation performance and readily decompose at high temperatures. This makes resins generally unsuitable for high-temperature processes. Accordingly, metals have been found to be effective for use as a high-heat-radiation joining material instead of resins. Joining using a metal is called metal joining. An example of a known joining material for metal joining is aluminum.

However, joining materials for metal joining, i.e., metals, are not as soft as resins and cannot therefore relieve the stress due to the large difference in linear thermal expansion coefficient between the electrostatic chuck and the cooling plate. Thus, there has been a need for the development of a cooling plate material suitable for metal joining to electrostatic chucks, i.e., a novel material that combines a small difference in linear thermal expansion coefficient from aluminum nitride with the properties required for cooling plates. The properties required for cooling plates include high thermal conductivity, which is required to ensure sufficient heat radiation performance, high density, which is required to allow a coolant to pass therethrough, and high strength, which is required to be resistant to, for example, processing.

In view of the foregoing problems, a primary object of the present invention is to provide a material having an extremely small difference in linear thermal expansion coefficient from aluminum nitride and sufficiently high thermal conductivity, density, and strength.

The inventors have studied the basic properties of various composite materials prepared by forming SiC-based powder mixtures containing TiC and $TiSi_2$ or TiC and Si and then performing hot-press firing and have found that a material having an extremely small difference in linear thermal expansion coefficient from aluminum nitride and sufficiently high thermal conductivity, density, and strength can be provided, thus completing the present invention.

That is, a dense composite material according to the present invention contains, in descending order of content, silicon carbide, titanium silicon carbide, and titanium carbide as three major constituents. The dense composite material contains 51% to 68% by mass of silicon carbide and no titanium silicide and has an open porosity of 1% or less.

A joined body according to the present invention includes a first plate made of such a dense composite material and a second plate made of aluminum nitride and joined to the first plate. A member for semiconductor manufacturing apparatuses according to the present invention uses such a joined body.

The dense composite material according to the present invention has an extremely small difference in linear thermal expansion coefficient from aluminum nitride and sufficiently high thermal conductivity, density, and strength. Accordingly, a joined body including a first plate made of such a dense composite material and a second plate made of aluminum nitride and joined to the first plate can be used as a member for semiconductor manufacturing apparatuses and provides an extended service life without separation of the first and second members after cycling between high and low temperatures.

DESCRIPTION OF THE PREFERRED EMBODIMENTS

Figure 1:
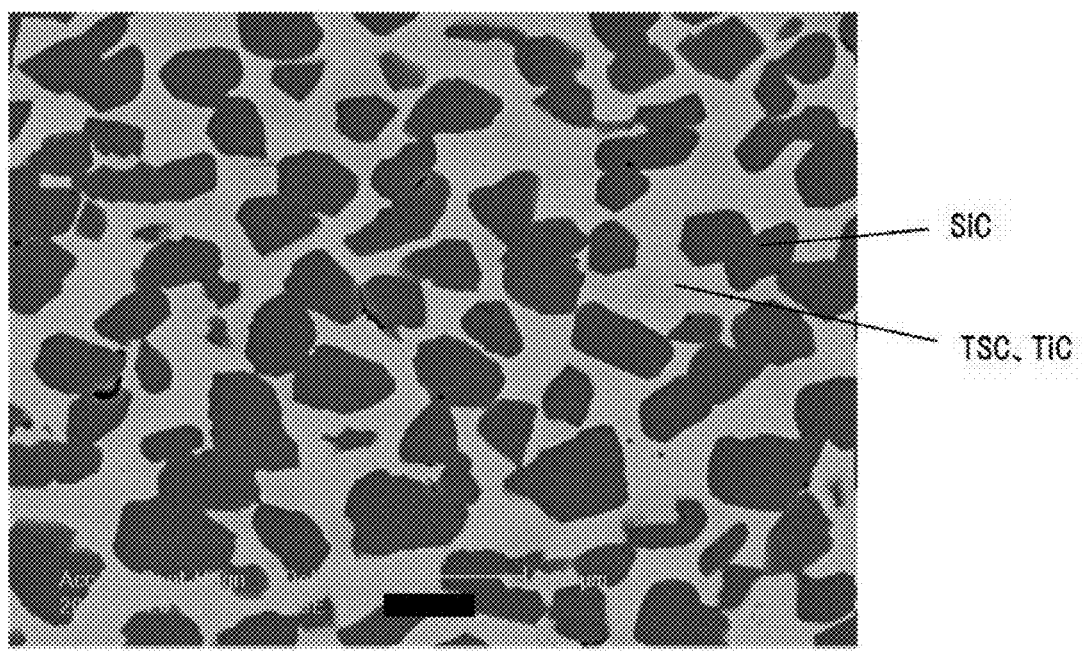
FIG. 1 shows an SEM image (backscattered electron image) of a dense composite material prepared in Experimental Example 5.

A dense composite material according to the present invention contains, in descending order of content, silicon carbide, titanium silicon carbide, and titanium carbide as three major constituents. The dense composite material contains 51% to 68% by mass of silicon carbide and no titanium silicide and has an open porosity of 1% or less. The content is determined based on an X-ray diffraction peak. The open porosity is measured by Archimedes' method using pure water as the medium.

The dense composite material contains 51% to 68% by mass of silicon carbide. A dense composite material containing less than 51% by mass of silicon carbide is not preferred because it has a large difference in linear thermal expansion coefficient from aluminum nitride. A dense composite material containing more than 68% by mass of silicon carbide is not preferred because it may have high open porosity and insufficient strength.

The dense composite material contains titanium silicon carbide in an amount smaller than the amount of silicon carbide and titanium carbide in an amount smaller than the amount of titanium silicon carbide. The titanium silicon carbide is preferably $Ti_3SiC_2$ (TSC), and the titanium carbide is preferably TiC. For example, the dense composite material preferably contains 27% to 40% by mass of titanium silicon carbide and 4% to 12% by mass of titanium carbide.

Preferably, silicon carbide is granular and at least one of titanium silicon carbide and titanium carbide is present in spaces between silicon carbide grains so as to cover the surface of the silicon carbide grains. If the silicon carbide grains are distributed with high frequency, pores tend to remain between the silicon carbide grains. As described above, if other grains cover the surface of the silicon carbide grains, they readily fill the pores, which is preferred to provide a dense and strong material.

The linear thermal expansion coefficient of the dense composite material according to the present invention is similar to that of aluminum nitride. Thus, if a member made of the dense composite material according to the present invention is joined to a member made of aluminum nitride (for example, by metal joining), they are resistant to separation after cycling between high and low temperatures. Specifically, the dense composite material according to the present invention preferably has a difference in average linear thermal expansion coefficient of 0.5 ppm/K or less from aluminum nitride at 40° C. to 570° C. More preferably, the dense composite material according to the present invention has an average linear thermal expansion coefficient of 5.4 to 6.0 ppm/K at 40° C. to 570° C. The average linear thermal expansion coefficient at 40° C. to 570° C. of an aluminum nitride sintered body to which 5% by weight of $Y_2O_3$ was added as a sintering aid was measured to be 5.7 ppm/K under the same conditions as that of the dense composite material according to the present invention, and the average linear thermal expansion coefficient of an aluminum nitride sintered body to which no sintering aid was added was measured to be 5.2 ppm/K. Accordingly, in the present invention, the middle value between the two linear thermal expansion coefficients, i.e., 5.5 ppm/K (at 40° C. to 570° C.), is used as the central value, and an object of the present invention is set to provide an aluminum nitride sintered body having a difference in average linear thermal expansion coefficient of 0.5 ppm/K or less.

The dense composite material according to the present invention, which has superior thermal conductivity, preferably has a thermal conductivity of 100 W/m·K or more. In this case, if a member made of the dense composite material according to the present invention is joined to a member made of aluminum nitride by metal joining, heat can be efficiently released from the aluminum nitride.

The dense composite material according to the present invention, which has superior strength, preferably has a four-point bending strength of 300 MPa or more. In this case, a member made of the dense composite material according to the present invention is easily applicable to, for example, cooling plates.

A joined body according to the present invention includes a first plate made of the dense composite material described above and a second plate made of aluminum nitride and joined to the first plate (for example, by metal joining). This joined body is applicable to, for example, members for semiconductor manufacturing apparatuses. An example of a member for semiconductor manufacturing apparatuses includes a cooling plate (first member) made of the dense composite material described above and an electrostatic chuck (second member) made of aluminum nitride and joined to the cooling plate with a joining material containing a major proportion of aluminum or an alloy thereof. Because the first member has an extremely small difference in linear thermal expansion coefficient from aluminum nitride, it is resistant to separation from the second member after cycling between high and low temperatures. Because the first member has sufficiently high thermal conductivity, it can efficiently cool the second member made of aluminum nitride. Because the first member has sufficiently high density, it permits a coolant to pass therethrough, thus further improving the cooling efficiency. Because the first member has sufficiently high strength, it is sufficiently resistant to processing and joining during the manufacture of the member for semiconductor manufacturing apparatuses described above and the stress due to a temperature difference during use as the member.

A method for manufacturing the dense composite material according to the present invention may include, for example, (a) a step of preparing a powder mixture containing 43% to 52% by mass of silicon carbide and 33% to 45% by mass of titanium carbide, the balance being 18% or less by mass of titanium silicide and/or 13% or less by mass of silicon; and (b) a step of sintering the powder mixture by hot pressing in an inert atmosphere to obtain the dense composite material described above.

In step (a), the average particle size of the silicon carbide material powder is preferably, but not limited to, 2 to 35 μm. The silicon carbide material powder may be composed only of coarse particles (for example, having an average particle size of 15 to 35 μm), may be composed only of fine particles (for example, having an average particle size of 2 to 10 μm), or may be composed of a mixture thereof. If the average particle size of SiC is smaller than 2 μm, the resulting sintered body has low density because the SiC particles have a large surface area and therefore decrease the sinterability of a composition having a high SiC content. If the average particle size of SiC is larger than 35 μm, the resulting sintered body has sufficient sinterability but may have low strength. Although the raw material powders used in step (a) may be silicon carbide, titanium carbide, and titanium silicide, as described above, suitable raw material powders may be selected from silicon carbide, titanium carbide, titanium silicide, titanium, and silicon.

In step (b), the inert atmosphere is, for example, a vacuum atmosphere, nitrogen atmosphere, or argon atmosphere. The hot pressing conditions may be set such that the dense composite material described above is obtained. For example, the pressure for hot pressing is preferably 100 to 400 kgf/cm², more preferably 200 to 300 kgf/cm². The temperature for hot pressing is preferably 1,550° C. to 1,800° C., more preferably 1,600° C. to 1,750° C. The relationship between the pressure and the temperature may be set within the above ranges depending on, for example, the composition of the powder mixture and the particle sizes of the raw material powders. For example, a powder mixture having a low silicon carbide content easily sinters and therefore becomes dense under relatively mild hot pressing conditions. In contrast, a powder mixture having a high silicon carbide content does not easily sinter and therefore becomes dense under relatively severe hot pressing conditions. A powder mixture containing silicon carbide composed only of coarse particles becomes dense under relatively severe hot pressing conditions, whereas a powder mixture containing silicon carbide composed of a mixture of coarse and fine particles becomes dense under relatively mild hot pressing conditions. The firing time may be set depending on the hot pressing conditions, for example, within the range of 1 to 10 hours. A powder mixture containing silicon carbide composed of a mixture of coarse and fine particles tends to become dense under milder hot pressing conditions and is therefore more preferred than a powder mixture containing silicon carbide composed only of coarse particles.

For example, if the powder mixture contains 43% to less than 47% by mass of silicon carbide, the hot pressing conditions in step (b), irrespective of whether the silicon carbide particles are coarse or fine, are preferably as follows: 1,600° C. to 1,800° C. and 200 to 400 kgf/cm$^2$. If the powder mixture contains 47% to 52% by mass of silicon carbide, the hot pressing conditions, irrespective of whether the silicon carbide particles are coarse or fine, are preferably as follows: 1,650° C. to 1,800° C. and 300 to 400 kgf/cm$^2$ or 1,750° C. to 1,800° C. and 250 to 400 kgf/cm$^2$. If the silicon carbide is composed of a mixture of coarse and fine particles, the hot pressing conditions are preferably as follows: 1,650° C. to 1,800° C. and 300 to 400 kgf/cm$^2$ or 1,700° C. to 1,800° C. and 250 to 400 kgf/cm$^2$.

EXAMPLES

Preferred examples of the present invention will now be described. As SiC materials, commercial products with purities of 96.0% or more and average particle sizes of 32.3 μm, 16.4 μm, and 2.9 μm were used. As a TiC material, a commercial product with a purity of 94.5% or more and an average particle size of 4.3 μm was used. As a TiSi$_2$ material, a commercial product with a purity of 96.0% or more and an average particle size of 6.9 μm was used. As a Si material, a commercial product with a purity of 97.0% or more and an average particle size of 2.1 μm was used. The present invention is not limited to the following examples.

1. Manufacturing Process

Formulation

The SiC materials, the TiC material, and the TiSi$_2$ material, or the SiC materials, the TiC material, and the Si material, were weighed out according to the mass percentages shown in Tables 1 and 2 and were wet-mixed in a nylon pot containing 10 mm diameter nylon balls with iron cores using isopropyl alcohol as a solvent for 4 hours. After mixing, the slurry was removed and dried at 110° C. under nitrogen flow. The dried mixture was then passed through a 30 mesh screen to obtain a powder formulation. It was demonstrated that a powder formulation prepared by weighing out and charging about 300 g of raw materials into a high-speed flow mixer (powder container capacity=1.8 L) and mixing it at an impeller rotational speed of 1,500 rpm had material properties similar to those of the powder formulation prepared by wet mixing.

Forming

The powder mixture was subjected to uniaxial pressing at a pressure of 200 kgf/cm$^2$ to form a disk-shaped compact having a diameter of about 50 mm and a thickness of about 15 ml, and it was placed in a graphite mold for firing.

Firing

The disk-shaped compact was fired by hot pressing to form a dense sintered material. Hot pressing was performed at the firing temperatures (maximum temperatures) and pressures shown in Tables 1 and 2 while maintaining a vacuum atmosphere until the end of firing. The firing temperature was maintained for 4 hours. Hot pressing is hereinafter abbreviated as HP.

2. Experimental Examples

Tables 1 and 2 show the starting material compositions (% by mass), the particle sizes and proportions of the SiC materials, the HP firing conditions, the constituent phases of sintered bodies and the contents thereof determined from the results of XRD measurements (results of simplified determination), and the basic properties of the sintered bodies (open porosity, bulk density, four-point bending strength, linear thermal expansion coefficient, and thermal conductivity) for the individual examples. Of Experimental Examples 1 to 36, Experimental Examples 3 to 7, 10, 12, 13, 15, 16, 18 to 21, 23, 24, 26, and 33 to 36 correspond to examples of the present invention, and the remaining experimental examples correspond to comparative examples.

TABLE 1

| No.: Experimental Example C: Comparative Example E: Example | Raw material composition: % by mass | | | | | Proportion of SiC | | | HP firing condition | |
|---|---|---|---|---|---|---|---|---|---|---|
| | SiC | TiC | TiSi$_2$ | Si | Sum | Proportion of 32.3 μm | Proportion of 16.4 μm | Proportion of 2.9 μm | Firing temperature (° C.) | Pressure (kg/cm$^2$) |
| No. 1 (C1) | 41.2 | 41.0 | 17.8 | — | 100 | 0 | 100 | 0 | 1700 | 200 |
| No. 2 (C2) | 41.2 | 41.0 | 17.8 | — | 100 | 0 | 0 | 100 | 1700 | 200 |
| No. 3 (E1) | 43.1 | 39.6 | 17.2 | — | 100 | 0 | 100 | 0 | 1600 | 200 |
| No. 4 (E2) | 43.1 | 39.6 | 17.2 | — | 100 | 0 | 100 | 0 | 1650 | 200 |
| No. 5 (E3) | 43.1 | 39.6 | 17.2 | — | 100 | 0 | 100 | 0 | 1700 | 200 |
| No. 6 (E4) | 43.1 | 39.6 | 17.2 | — | 100 | 0 | 0 | 100 | 1700 | 200 |
| No. 7 (E5) | 49.2 | 35.3 | 15.5 | — | 100 | 0 | 100 | 0 | 1650 | 300 |
| No. 8 (C3) | 49.2 | 35.3 | 15.5 | — | 100 | 0 | 100 | 0 | 1700 | 200 |
| No. 9 (C4) | 49.2 | 35.3 | 15.5 | — | 100 | 0 | 100 | 0 | 1700 | 250 |
| No. 10 (E6) | 49.2 | 35.3 | 15.5 | — | 100 | 0 | 100 | 0 | 1700 | 300 |
| No. 11 (C5) | 49.2 | 35.3 | 15.5 | — | 100 | 0 | 100 | 0 | 1750 | 200 |
| No. 12 (E7) | 49.2 | 35.3 | 15.5 | — | 100 | 0 | 100 | 0 | 1750 | 250 |
| No. 13 (E8) | 49.2 | 35.3 | 15.5 | — | 100 | 0 | 65 | 35 | 1650 | 300 |

TABLE 1-continued

| No. | SiC | TiC | TiSi₂ | | Sum | | | | | |
|---|---|---|---|---|---|---|---|---|---|---|
| No. 14 (C6) | 49.2 | 35.3 | 15.5 | — | 100 | 0 | 65 | 35 | 1700 | 200 |
| No. 15 (E9) | 49.2 | 35.3 | 15.5 | — | 100 | 0 | 65 | 35 | 1700 | 250 |
| No. 16 (E10) | 49.2 | 35.3 | 15.5 | — | 100 | 0 | 65 | 35 | 1700 | 300 |
| No. 17 (C7) | 49.2 | 35.3 | 15.5 | — | 100 | 0 | 65 | 35 | 1725 | 200 |
| No. 18 (E11) | 49.2 | 35.3 | 15.5 | — | 100 | 0 | 65 | 35 | 1750 | 250 |
| No. 19 (E12) | 49.2 | 35.3 | 15.5 | — | 100 | 65 | 0 | 35 | 1725 | 200 |
| No. 20 (E13) | 49.2 | 35.3 | 15.5 | — | 100 | 55 | 0 | 45 | 1725 | 200 |

| No.: Experimental Example C: Comparative Example E: Example | XRD constituent phases (% by mass) | | | | | Basic properties of sintered body | | | | |
|---|---|---|---|---|---|---|---|---|---|---|
| | SiC | TSC | TiC | TiSi₂ | Sum | Open porosity (%) | Bulk density (g/cm³) | Four-point bending strength (MPa) | Linear thermal expansion coefficient (ppm/K) | Thermal conductivity (W/mK) |
| No. 1 (C1) | 50.1 | 41.9 | 8 | —*1 | 100 | 0.0 | 3.80 | 359 | 6.2 | 102 |
| No. 2 (C2) | 47.9 | 40.5 | 11.6 | — | 100 | 0.0 | 3.80 | 370 | 6.1 | 98 |
| No. 3 (E1) | 51.1 | 39.3 | 9.6 | — | 100 | 0.0 | 3.75 | 368 | 6.0 | 105 |
| No. 4 (E2) | 52.8 | 36.1 | 11.1 | — | 100 | 0.0 | 3.74 | 371 | 6.0 | 104 |
| No. 5 (E3) | 51.5 | 39.1 | 9.4 | — | 100 | 0.0 | 3.74 | 350 | 5.9 | 107 |
| No. 6 (E4) | 52.9 | 38.1 | 9 | — | 100 | 0.0 | 3.75 | 375 | 6.0 | 102 |
| No. 7 (E5) | 63.5 | 29.2 | 7.3 | — | 100 | 0.9 | 3.55 | 310 | 5.8 | 120 |
| No. 8 (C3) | 64.1 | 29.8 | 6.1 | — | 100 | 7.0 | 3.34 | 199 | 5.8 | 110 |
| No. 9 (C4) | 63.7 | 30.1 | 6.2 | — | 100 | 1.9 | 3.52 | 313 | 5.8 | 115 |
| No. 10 (E6) | 63.4 | 30.4 | 6.2 | — | 100 | 0.2 | 3.58 | 346 | 5.8 | 123 |
| No. 11 (C5) | 60.6 | 31.5 | 7.9 | — | 100 | 6.8 | 3.35 | 205 | 5.8 | 109 |
| No. 12 (E7) | 59.4 | 33.1 | 7.5 | — | 100 | 0.0 | 3.72 | 375 | 5.8 | 119 |
| No. 13 (E8) | 62.9 | 29.1 | 8.0 | — | 100 | 0.9 | 3.62 | 330 | 5.8 | 121 |
| No. 14 (C6) | 64.3 | 29.3 | 6.4 | — | 100 | 5.0 | 3.47 | 279 | 5.7 | 115 |
| No. 15 (E9) | 65.4 | 29.6 | 5 | — | 100 | 0.4 | 3.59 | 364 | 5.7 | 123 |
| No. 16 (E10) | 65.2 | 29.4 | 5.4 | — | 100 | 0.0 | 3.68 | 417 | 5.7 | 125 |
| No. 17 (C7) | 62.3 | 31.9 | 5.8 | — | 100 | 1.7 | 3.58 | 311 | 5.8 | 117 |
| No. 18 (E11) | 60.9 | 30.8 | 8.3 | — | 100 | 0.0 | 3.73 | 390 | 5.8 | 121 |
| No. 19 (E12) | 65.1 | 30.4 | 4.5 | — | 100 | 0.8 | 3.62 | 325 | 5.8 | 117 |
| No. 20 (E13) | 64.3 | 29.9 | 5.8 | — | 100 | 0.5 | 3.67 | 318 | 5.7 | 119 |

*1 "—" indicates that the corresponding constituent phase was not detected in the XRD profile.

TABLE 2

| No.: Experimental Example C: Comparative Example E: Example | Raw material composition: % by mass | | | | | Proportion of SiC | | | HP firing condition | |
|---|---|---|---|---|---|---|---|---|---|---|
| | SiC | TiC | TiSi₂ | Si | Sum | Proportion of 32.3 μm | Proportion of 16.4 μm | Proportion of 2.9 μm | Firing temperature (° C.) | Pressure (kg/cm²) |
| No. 21 (E14) | 51.4 | 33.7 | 14.8 | — | 100 | 0 | 65 | 35 | 1650 | 300 |
| No. 22 (C8) | 51.4 | 33.7 | 14.8 | — | 100 | 0 | 65 | 35 | 1700 | 200 |
| No. 23 (E15) | 51.4 | 33.7 | 14.8 | — | 100 | 0 | 65 | 35 | 1700 | 250 |
| No. 24 (E16) | 51.4 | 33.7 | 14.8 | — | 100 | 0 | 65 | 35 | 1700 | 300 |
| No. 25 (C9) | 51.4 | 33.7 | 14.8 | — | 100 | 0 | 65 | 35 | 1750 | 200 |
| No. 26 (E17) | 51.4 | 33.7 | 14.8 | — | 100 | 0 | 65 | 35 | 1750 | 250 |
| No. 27 (C10) | 53.8 | 32.1 | 14.1 | — | 100 | 0 | 65 | 35 | 1700 | 200 |
| No. 28 (C11) | 53.8 | 32.1 | 14.1 | — | 100 | 0 | 65 | 35 | 1700 | 250 |
| No. 29 (C12) | 53.8 | 32.1 | 14.1 | — | 100 | 0 | 65 | 35 | 1700 | 300 |
| No. 30 (C13) | 53.8 | 32.1 | 14.1 | — | 100 | 0 | 65 | 35 | 1750 | 200 |
| No. 31 (C14) | 53.8 | 32.1 | 14.1 | — | 100 | 0 | 65 | 35 | 1750 | 250 |
| No. 32 (C15) | 53.8 | 32.1 | 14.1 | — | 100 | 0 | 65 | 35 | 1750 | 300 |
| No. 33 (E18) | 43.2 | 44.2 | — | 12.6 | 100 | 0 | 65 | 35 | 1700 | 200 |
| No. 34 (E19) | 43.2 | 44.2 | — | 12.6 | 100 | 0 | 65 | 35 | 1725 | 200 |
| No. 35 (E20) | 43.2 | 44.2 | — | 12.6 | 100 | 0 | 65 | 35 | 1750 | 200 |
| No. 36 (E21) | 43.2 | 44.2 | — | 12.6 | 100 | 0 | 55 | 45 | 1750 | 200 |

TABLE 2-continued

| No.: Experimental Example C: Comparative Example E: Example | XRD constituent phases (% by mass) | | | | | Basic properties of sintered body | | | | |
|---|---|---|---|---|---|---|---|---|---|---|
| | SiC | TSC | TiC | TiSi$_2$ | Sum | Open porosity (%) | Bulk density (g/cm$^3$) | Four-point bending strength (MPa) | Linear thermal expansion coefficient (ppm/K) | Thermal conductivity (W/mK) |
| No. 21 (E14) | 67.9 | 27.4 | 4.7 | — | 100 | 0.9 | 3.54 | 310 | 5.5 | 130 |
| No. 22 (C8) | 67.5 | 27.1 | 5.4 | — | 100 | 5.7 | 3.37 | 255 | 5.5 | 123 |
| No. 23 (E15) | 67.7 | 28.1 | 4.2 | — | 100 | 0.7 | 3.55 | 340 | 5.5 | 131 |
| No. 24 (E16) | 66.4 | 27.8 | 5.8 | — | 100 | 0.4 | 3.55 | 341 | 5.4 | 128 |
| No. 25 (C9) | 66.2 | 27.2 | 6.6 | — | 100 | 5.3 | 3.38 | 241 | 5.5 | 125 |
| No. 26 (E17) | 66.4 | 28.2 | 5.4 | — | 100 | 0.2 | 3.56 | 361 | 5.4 | 130 |
| No. 27 (C10) | 68.7 | 26.9 | 4.4 | — | 100 | 14.0 | 3.07 | 185 | 5.3 | 126 |
| No. 28 (C11) | 70.1 | 25.1 | 4.8 | — | 100 | 10.1 | 3.21 | 191 | 5.3 | 125 |
| No. 29 (C12) | 71.4 | 24.8 | 3.8 | — | 100 | 4.8 | 3.40 | 205 | 5.2 | 130 |
| No. 30 (C13) | 70.7 | 25.2 | 4.1 | — | 100 | 12.0 | 3.14 | 179 | 5.2 | 122 |
| No. 31 (C14) | 69.5 | 26.3 | 4.2 | — | 100 | 7.1 | 3.32 | 198 | 5.2 | 129 |
| No. 32 (C15) | 70.4 | 25.7 | 3.9 | — | 100 | 3.8 | 3.18 | 215 | 5.3 | 131 |
| No. 33 (E18) | 62.4 | 29.7 | 7.9 | — | 100 | 0.9 | 3.64 | 335 | 5.8 | 122 |
| No. 34 (E19) | 62.0 | 29.9 | 8.1 | — | 100 | 0.4 | 3.68 | 319 | 5.8 | 120 |
| No. 35 (E20) | 61.2 | 31.0 | 7.8 | — | 100 | 0.1 | 3.73 | 337 | 5.9 | 119 |
| No. 36 (E21) | 61.9 | 30.4 | 7.7 | — | 100 | 0.1 | 3.72 | 333 | 5.8 | 120 |

3. Simplified Determination of Constituent Phases

A composite material crushed in a mortar was analyzed using an X-ray diffractometer to identify the crystal phases thereof. The measurement conditions were as follows: Cu—Kα, 40 kV, 40 mA, and 2θ=5° to 70°. A sealed-tube X-ray diffractometer (D8 ADVANCE from Bruker AXS) was used. Also, simplified determination of the constituent phases was performed. In the simplified determination, the contents of the crystal phases in the composite material were determined based on an X-ray diffraction peak. The simplified determination was performed on SiC, TSC (Ti$_3$SiC$_2$), TiC, and TiSi$_2$ to determine the contents thereof. The simplified determination was performed using the simple profile fitting function (FPM Eval.) of the powder diffraction data analysis software "EVA" from Bruker AXS. This function calculates the contents of the constituent phases using the I/I$_{cor}$ (the intensity ratio to the diffraction intensity of corundum) of ICDD PDF cards for identified crystal phases. The PDF card numbers for the individual crystal phases are as follows: SiC: 00-049-1428, TSC: 01-070-6397, TiC: 01-070-9258 (TiC$_{0.62}$), TiSi$_2$: 01-071-0187. In Tables 1 and 2, "—" indicates that the corresponding constituent phase was not detected in the XRD profile.

4. Measurements of Basic Properties (1) Open Porosity and Bulk Density

The open porosity and the bulk density were measured by Archimedes' method using pure water as the medium.

(2) Four-Point Bending Strength

The four-point bending strength was determined in accordance with JIS-R1601.

(3) Linear Thermal Expansion Coefficient (Average Linear Thermal Expansion Coefficient at 40° C. to 570° C.)

A sample was heated to 650° C. twice at a heating rate of 20° C./min in an argon atmosphere using a TD5020S (horizontal differential expansion measurement system) available from Broker AXS, and the average linear thermal expansion coefficient at 40° C. to 570° C. was calculated from the data obtained by the second measurement. The standard sample used was an aluminum standard sample (having a purity of 99.7%, a bulk density of 3.9 g/cm$^3$, and a length of 20 mm) supplied with the system. Another aluminum standard sample was obtained, and the linear thermal expansion coefficient thereof was measured to be 7.7 ppm/K under the same conditions. Under the same conditions, the average linear thermal expansion coefficient of an aluminum nitride sintered body to which 5% by weight of Y$_2$O$_3$ was added as a sintering aid was measured to be 5.7 ppm/K at 40° C. to 570° C., and the average linear thermal expansion coefficient of an aluminum nitride sintered body to which no sintering aid was added was measured to be 5.2 ppm/K.

(4) Thermal Conductivity

The thermal conductivity was measured by laser flashing.

5. Results (1) Experimental Examples 1 and 2

Powder formulations having the same raw material composition were fired under the same HP firing conditions except that the SiC material having an average particle size of 16.4 μm was used in Experimental Example 1 and the SiC material having an average particle size of 2.9 μm was used in Experimental Example 2. The SiC content of the powder formulations was 41.2% by mass. As a result, dense composite materials having an open porosity of 0% were obtained in Experimental Examples 1 and 2, although they had differences in thermal expansion coefficient of more than 0.5 ppm/K from aluminum nitride. The thermal expansion coefficient was insufficiently reduced in Experimental Examples 1 and 2 probably because the use of an insufficient amount of SIC material resulted in insufficient SiC contents of the resulting dense composite materials, i.e., 50.1% by mass and 47.9% by mass.

(2) Experimental Examples 3 to 6

Figure 2:
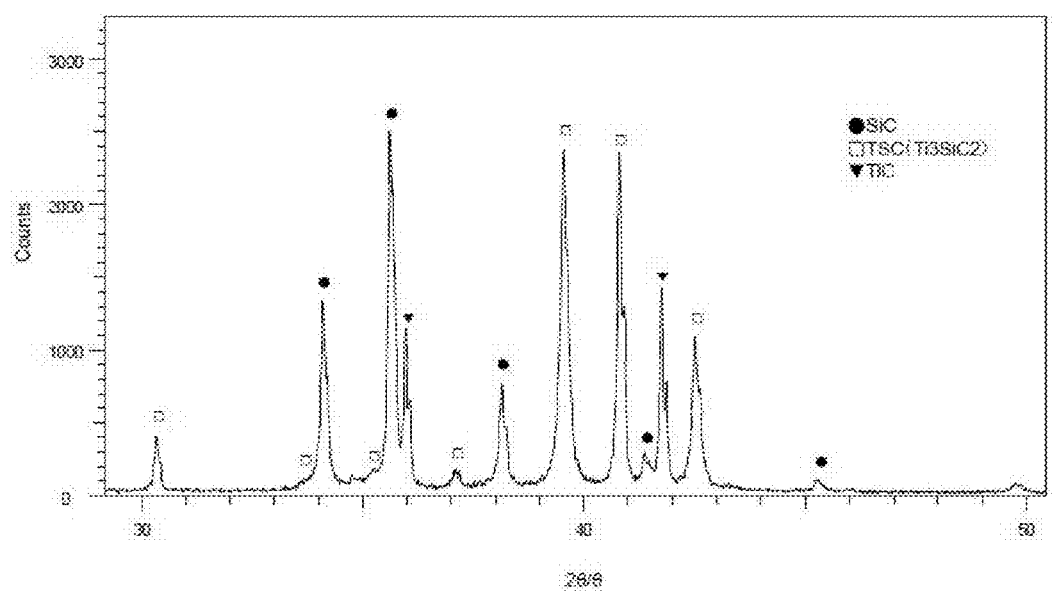
FIG. 2 shows an XRD profile of the dense composite material prepared in Experimental Example 5.

In Experimental Examples 3 to 5, powder formulations having the same raw material composition and containing the SIC material having an average particle size of 16.4 μm were fired except that they were fired under different HP firing conditions. The SiC content of the powder formulations was 43.1% by mass. As a result, dense composite materials having SiC contents of 51% to 53% by mass, an open porosity of 0%, and a thermal expansion coefficient of 5.9 to 6.0 ppm/K were obtained in Experimental Examples 3 to 5. These dense composite materials had four-point bending strengths of more than 300 MPa and thermal conductivities of more than 100 W/m·K. In Experimental Example 6, a powder formulation having the same raw material composition was fired under the same HP firing conditions as in Experimental Example 5 except that the SiC material having an average particle size of 2.9 μm was used. As a result, a dense composite material having properties similar to those of the dense composite material of Experimental Example 5 was obtained in Experimental Example 6. As a representative example, FIGS. 1 and 2 show an SEM image (backscattered electron image) and an XRD profile, respectively, of the dense composite material prepared in Experimental Example 5. As shown in FIG. 1, the surface of the SiC grains was covered with at least one of TSC and TiC. Similar SEM images and XRD profiles were obtained in other experimental examples.

(3) Experimental Examples 7 to 12

In Experimental Examples 7 to 12, powder formulations having the same raw material composition and containing the SiC material having an average particle size of 16.4 μm were fired except that they were fired under different HP firing conditions. The SiC content of the powder formulations was 49.2% by mass. As a result, dense composite materials having SiC contents of 59% to 64% by mass, open porosities of 0.2% to 0.9%, and a thermal expansion coefficient of 5.8 ppm/K were obtained in Experimental Examples 7, 10, and 12. These dense composite materials had four-point bending strengths of more than 300 MPa and thermal conductivities of more than 100 W/m·K. In contrast, in Experimental Examples 8, 9, and 11, composite materials having a thermal expansion coefficient of 5.8 ppm/K were obtained, although they had open porosities of more than 1%. These composite materials had such high open porosities probably because, although they were fired at a temperature of 1,700° C. as the HP firing conditions in Experimental Examples 8 and 9 and at a temperature of 1,750° C. as the HP firing conditions in Experimental Example 11, they were pressed at insufficient pressures. In Experimental Examples 7, 10, and 12, SEM images and XRD profiles similar to those in FIGS. 1 and 2 were obtained.

(4) Experimental Examples 13 to 18

Figure 3:
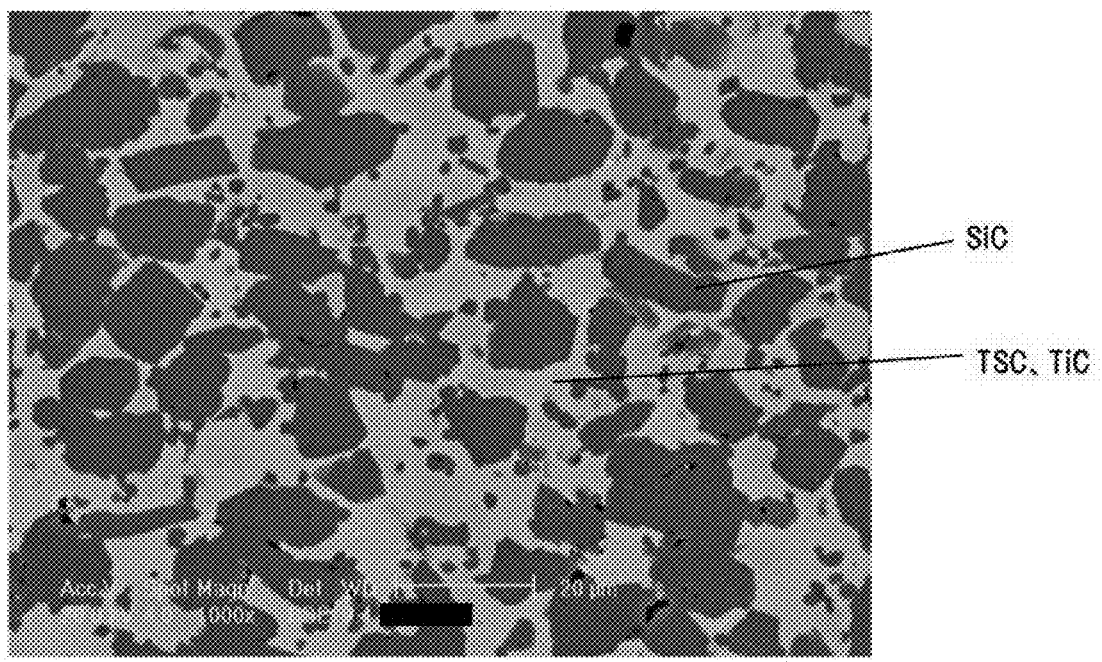
FIG. 3 shows an SEM image (backscattered electron image) of a dense composite material prepared in Experimental Example 15.
Figure 4:
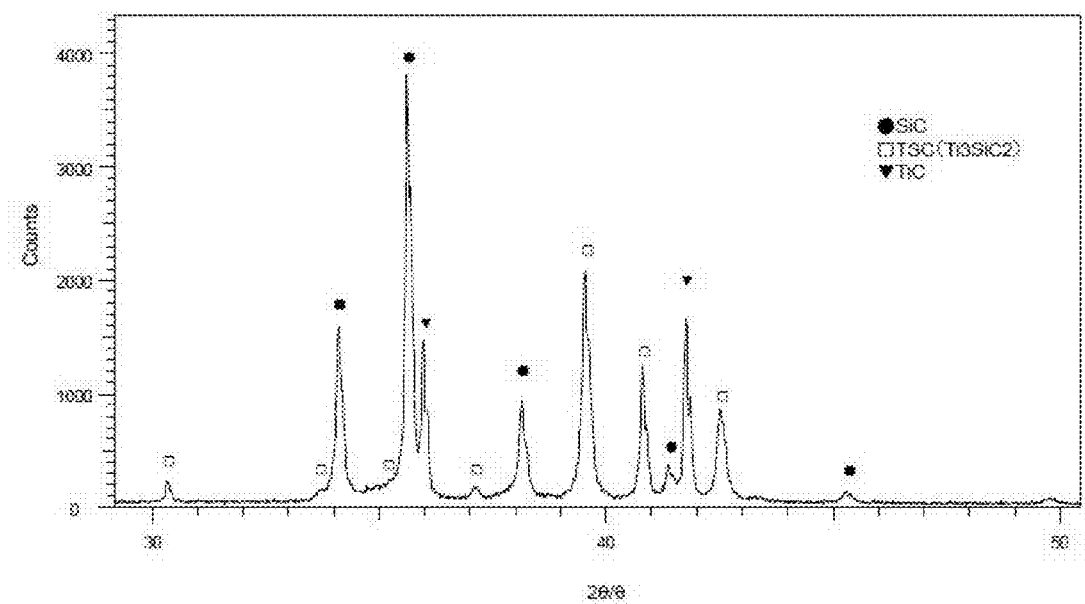
FIG. 4 shows an XRD profile of the dense composite material prepared in Experimental Example 15.

In Experimental Examples 13 to 18, powder formulations having the same raw material composition and containing a mixture of the SiC material having an average particle size of 16.4 μm and the SIC material having an average particle size of 2.9 μm in a ratio (mass ratio) of 65:35 were fired except that they were fired under different HP firing conditions. The SIC content of the powder formulations was 49.2% by mass. As a result, dense composite materials having SiC contents of 60.9% to 65.4% by mass, open porosities of 0% to 0.9%, and thermal expansion coefficients of 5.7 to 5.8 ppm/K were obtained in Experimental Examples 13, 15, 16, and 18. These dense composite materials had four-point bending strengths of more than 300 MPa and thermal conductivities of more than 100 W/m·K. In contrast, in Experimental Examples 14 and 17, composite materials having thermal expansion coefficients of 5.7 to 5.8 ppm/K were obtained, although they had open porosities of more than 1%. These composite materials had such high open porosities probably because, although they were fired at a temperature of 1,700° C. as the HP firing conditions in Experimental Example 14 and at a temperature of 1,725° C. as the HP firing conditions in Experimental Example 17, they were pressed at insufficient pressures. As a representative example, FIGS. 3 and 4 show an SEM image (backscattered electron image) and an XRD profile, respectively, of the dense composite material prepared in Experimental Example 15. As shown in FIG. 3, the surface of the SIC grains was covered with at least one of TSC and TiC. In Experimental Examples 13, 16, and 18, SEM images and XRD profiles similar to those in FIGS. 3 and 4 were obtained.

In Experimental Examples 15 and 9, powder formulations having the same raw material composition were fired under the same HP firing conditions except that a SiC material composed of coarse particles and fine particles was used in Experimental Example 15 and a SiC material composed only of coarse particles was used in Experimental Example 9. As a result, whereas the sintered body of Experimental Example 9 became insufficiently dense (open porosity=1.9%), the sintered body of Experimental Example 15 became sufficiently dense (open porosity=0.4%). These results demonstrate that the use of a SiC material composed of coarse particles and fine particles tends to provide a higher density than the use of a SiC material composed only of coarse particles.

(5) Experimental Examples 19 and 20

In Experimental Examples 19 and 20, powder formulations having the same raw material composition were fired under the same HP firing conditions except that different SiC materials were used. In Experimental Example 19, a mixture of the SIC material having an average particle size of 32.3 μm and the SiC material having an average particle size of 2.9 μm in a ratio (mass ratio) of 65:35 was used. In Experimental Example 20, a mixture of the SiC material having an average particle size of 32.3 μm and the SiC material having an average particle size of 2.9 μm in a ratio (mass ratio) of 55:45 was used. The SIC content of the powder formulations was 49.2% by mass. As a result, dense composite materials having SiC contents of 64% to 66% by mass, open porosities of 0.5% to 0.8%, and thermal expansion coefficients of 5.7 to 5.8 ppm/K were obtained. These dense composite materials had four-point bending strengths of more than 300 MPa and thermal conductivities of more than 100 W/m·K. In Experimental Examples 19 and 20, SEM images and XRD profiles similar to those in FIGS. 3 and 4 were obtained.

In Experimental Examples 17 and 19, powder formulations having the same raw material composition were fired under the same HP firing conditions except that the SiC material having an average particle size of 16.4 μm was used in Experimental Example 17 and the SIC material having an average particle size of 32.3 μm was used in Experimental Example 19. As a result, whereas the sintered body of Experimental Example 17 became insufficiently dense (open porosity=1.7%), the sintered body of Experimental Example 19 became sufficiently dense (open porosity=0.8%). These results demonstrate that the use of a SiC material composed of coarse particles having a larger average particle size tends to provide a higher density than the use of a SiC material composed of coarse particles having a smaller average particle size when using coarse SIC material composed of different particles size. In particular, if a large amount of SiC material is used, increasing the proportion of coarse SiC particles is effective in providing a higher density.

(6) Experimental Examples 21 to 26

In Experimental Examples 21 to 26, powder formulations having the same raw material composition and containing a mixture of the SiC material having an average particle size of 16.4 μm and the SiC material having an average particle size of 2.9 μm in a ratio (mass ratio) of 65:35 were fired except that they were fired under different HP firing conditions. The SiC content of the powder formulations was 51.4% by mass. As a result, dense composite materials having SiC contents of 66% to 68% by mass, open porosities of 0.2% to 0.9%, and thermal expansion coefficients of 5.4 to 5.5 ppm/K were obtained in Experimental Examples 21, 23, 24, and 26. These dense composite materials had four-point bending strengths of more than 300 MPa and thermal conductivities of more than 100 W/m·K. In contrast, in Experimental Examples 22 and 25, composite materials having a thermal expansion coefficient of 5.5 ppm/K were obtained, although they had open porosities of more than 1%. These composite materials had such high open porosities probably because, although they were fired at a temperature of 1,700° C. as the HP firing conditions in Experimental Example 22 and at a temperature of 1,750° C. as the HP firing conditions in Experimental Example 25, they were pressed at insufficient pressures. In Experimental Examples 21, 23, 24, and 26, SEM images and XRD profiles similar to those in FIGS. 3 and 4 were obtained.

(7) Experimental Examples 27 to 32

In Experimental Examples 27 to 32, powder formulations having the same raw material composition and containing a mixture of the SiC material having an average particle size of 16.4 μm and the SiC material having an average particle size of 2.9 μm in a ratio (mass ratio) of 65:35 were fired except that they were fired under different HP firing conditions. The SiC content of the powder formulations was 53.8% by mass. As a result, composite materials having SiC contents of 68% to 72% by mass and thermal expansion coefficients of 5.2 to 5.3 ppm/K were obtained in Experimental Examples 27 to 32, although they had open porosities of more than 1%. The composite materials of Experimental Examples 27 to 32 had such high open porosities probably because they contained excessive amounts of SiC materials and thus failed to sinter sufficiently during HP.

(8) Experimental Examples 33 to 36

In Experimental Examples 33 to 36, powder formulations containing TiC and Si instead of $TiSi_2$ as raw materials, containing a mixture of the SiC material having an average particle size of 16.4 μm and the SiC material having an average particle size of 2.9 μm in a ratio (mass ratio) of 65:35, and having the raw material composition SiC:TiC:Si=43.2:44.2:12.6 (mass ratio) were fired under different HP firing conditions. As a result, dense composite materials having SiC contents of 61% to 63% by mass, open porosities of 0.1% to 0.9%, and thermal expansion coefficients of 5.8 to 5.9 ppm/K were obtained. These dense composite materials had four-point bending strengths of more than 300 MPa and thermal conductivities of more than 100 W/m·K.

In Experimental Examples 14 and 17 and Experimental Examples 33 and 34, powder formulations were fired under the same HP firing conditions except that raw materials of different types and compositions were used. As a result, whereas the sintered bodies of Experimental Examples 14 and 17 became insufficiently dense, the sintered bodies of Experimental Examples 33 and 34 became sufficiently dense. These results demonstrate that, because the SiC contents of Experimental Examples 33 and 34 are similar and the SiC contents of Experimental Examples 14 and 17 are similar, reducing the amounts of SIC and $TiSi_2$ materials and instead using TIC and Si materials having smaller average particle sizes than $TiSi_2$ to adjust the Si, Ti, and C contents tends to provide a higher density.

(9) Conclusion

The dense composite materials prepared in Experimental Examples 3 to 7, 10, 12, 13, 15, 16, 18 to 21, 23, 24, 26, and 33 to 36 had open porosities of less than 1%, substantially the same linear thermal expansion coefficient as aluminum nitride (5.4 to 6.0 ppm/K at 40° C. to 570° C.), and sufficiently high thermal conductivities, densities, and strengths. Thus, a member for semiconductor manufacturing apparatuses that includes a first plate made of such a dense composite material and a second plate made of aluminum nitride and joined to the first plate by metal joining provides an extended service life without separation of the first and second members after cycling between high and low temperatures. These experimental examples (corresponding to examples of the present invention) show that the powder formulations for preparing the dense composite materials contain 43% to 52% by mass of SiC, 33% to 45% by mass of TiC, and 14% to 18% by mass of $TiSi_2$, and the dense composite materials contain 51% to 68% by mass of SiC, 27% to 40% by mass of TSC, and 4% to 12% by mass of TiC. The results of Experimental Examples 33 to 36 show that a dense composite material having similar properties can be prepared by partially or completely replacing the SIC and $TiSi_2$ materials with raw materials such as TIC and Si. In this case, the powder formulations contain 43% to 52% by mass of SiC and 33% to 45% by mass of titanium carbide, the balance being 18% or less by mass of titanium silicide and/or 13% or less by mass of Si.

6. Joined Body (1) On the dense composite material sample prepared in Experimental Example 18 (having a diameter of 50 mm and a thickness of 8 mm), a metal foil made of aluminum and having a thickness of 200 μm (having the same diameter as the above sample) and a dense aluminum nitride sintered body having a thickness of 8 mm (having the same diameter as the above sample) were stacked in the above order, and it was placed in a graphite mold for firing and was fired by hot pressing in a vacuum at a pressure of 100 kgf/cm² and 600° C. As a result, a joined body (metal-joined joined body) having no peeling or void at the interface thereof was obtained.

(2) A powder formulation having the raw material composition of Experimental Example 18 was subjected to uniaxial pressing at a pressure of 200 kgf/cm² to form a disk-shaped compact having a diameter of about 50 mm and a thickness of about 15 mm. On this compact, a dense aluminum nitride sintered body having a diameter of about 50 mm and a thickness of about 8 mm was stacked, and it was placed in a graphite mold for firing and was fired by hot pressing in a vacuum at a pressure of 250 kgf/cm² and 1,750° C. As a result, a joined body (directly joined body) having no peeling or void at the interface thereof was obtained.

The present application claims priority from Japanese Patent Application No. 2013-061856 filed on Mar. 25, 2013, the entire contents of which are incorporated herein by reference.

INDUSTRIAL APPLICABILITY

A dense composite material according to the present invention is applicable, for example, to a cooling plate for metal joining to a member such as an aluminum nitride electrostatic chuck or susceptor.

What is claimed is:

1. A dense composite material, containing, in descending order of content, silicon carbide, titanium silicon carbide, and titanium carbide as three major constituents, containing 51% to 68% by mass of the silicon carbide and no titanium silicide and having an open porosity of 1% or less.

2. The dense composite material according to claim 1, containing 27% to 40% by mass of the titanium silicon carbide and 4% to 12% by mass of the titanium carbide.

3. The dense composite material according to claim 1, wherein silicon carbide is granular and at least one of the titanium silicon carbide and the titanium carbide is present in spaces between the silicon carbide grains so as to cover the surface of the silicon carbide grains.

4. The dense composite material according to claim 1, wherein a difference in average linear thermal expansion coefficient is 0.5 ppm/K or less from aluminum nitride at 40° C. to 570° C.

5. The dense composite material according to claim 1, wherein an average linear thermal expansion coefficient is 5.4 to 6.0 ppm/K at 40° C. to 570° C.

6. The dense composite material according to claim 1, wherein a thermal conductivity is 100 W/m·K or more and four-point bending strength is 300 MPa or more.

7. A joined body, wherein a first plate made of the dense composite material according to claim 1 is joined to a second plate made of aluminum nitride.

8. The joined body according to claim 7, wherein the first plate is joined to the second plate by metal joining.

9. A member for semiconductor manufacturing apparatus comprising the joined body according to claim 7.

10. A method for manufacturing a dense composite material comprising steps of;
   (a) a step of preparing a powder mixture containing 43% to 52% by mass of silicon carbide and 33% to 45% by mass of titanium carbide, the balance being 18% or less by mass of titanium silicide and/or 13% or less by mass of silicon; and
   (b) a step of sintering the powder mixture by hot pressing in an inert atmosphere to obtain the dense composite material according to claim 1.

* * * * *